United States Patent [19]
Jain

[11] Patent Number: 5,652,645
[45] Date of Patent: Jul. 29, 1997

[54] HIGH-THROUGHPUT, HIGH-RESOLUTION, PROJECTION PATTERNING SYSTEM FOR LARGE, FLEXIBLE, ROLL-FED, ELECTRONIC-MODULE SUBSTRATES

[75] Inventor: Kanti Jain, Elmsford, N.Y.

[73] Assignee: Anvik Corporation, Hawthorne, N.Y.

[21] Appl. No.: 506,232

[22] Filed: Jul. 24, 1995

[51] Int. Cl.$^6$ .................... G03B 27/42; G03B 27/44; G03B 27/48

[52] U.S. Cl. ................ 355/53; 355/54; 355/50; 355/72

[58] Field of Search .................... 355/53, 54, 64, 355/72, 73

[56] References Cited

U.S. PATENT DOCUMENTS

| | | | |
|---|---|---|---|
| 5,198,857 | 3/1993 | Goto | 355/53 |
| 5,291,240 | 3/1994 | Jain | 355/53 |
| 5,563,095 | 10/1996 | Frey | 437/141 |

*Primary Examiner*—Arthur T. Grimley
*Assistant Examiner*—Herbert V. Kerner
*Attorney, Agent, or Firm*—Carl C. Kling

[57] ABSTRACT

A projection imaging system is described for patterning large, flexible substrates at high exposure speeds and desired resolution, the substrates being in the form of a continuous band fed from a roller for cost-effective electronic module manufacturing. From the continuous band, segments of one panel size are sequentially exposed one at a time. The segment being exposed is held rigidly on a scanning stage, on which is also mounted a mask containing the pattern to be formed on the substrate. The imaging subsystem is stationary and situated above the scanning stage. The mask is illuminated with a hexagonal illumination beam and a region of similar shape is imaged on the substrate. The stage is programmed to scan the mask and substrate simultaneously across the hexagonal regions so as to pattern one whole panel. Provision is made for suitable overlap between the complementary intensity profiles produced by the hexagonal illumination, which ensures seamless joining of the scans and uniform patterning of an entire panel without image stitching errors. For handling the roll substrate so that the substrate segment being exposed remains held rigidly to the scanning stage while the stage moves it in two dimensions without damaging the integrity of the substrate band, mechanisms are provided in the projection system which include provision of managed slack lengths in the substrate band, controlled rotary motions of the supply and take-up substrate rollers, and synchronized, laterally sliding assemblies for the rollers.

37 Claims, 6 Drawing Sheets

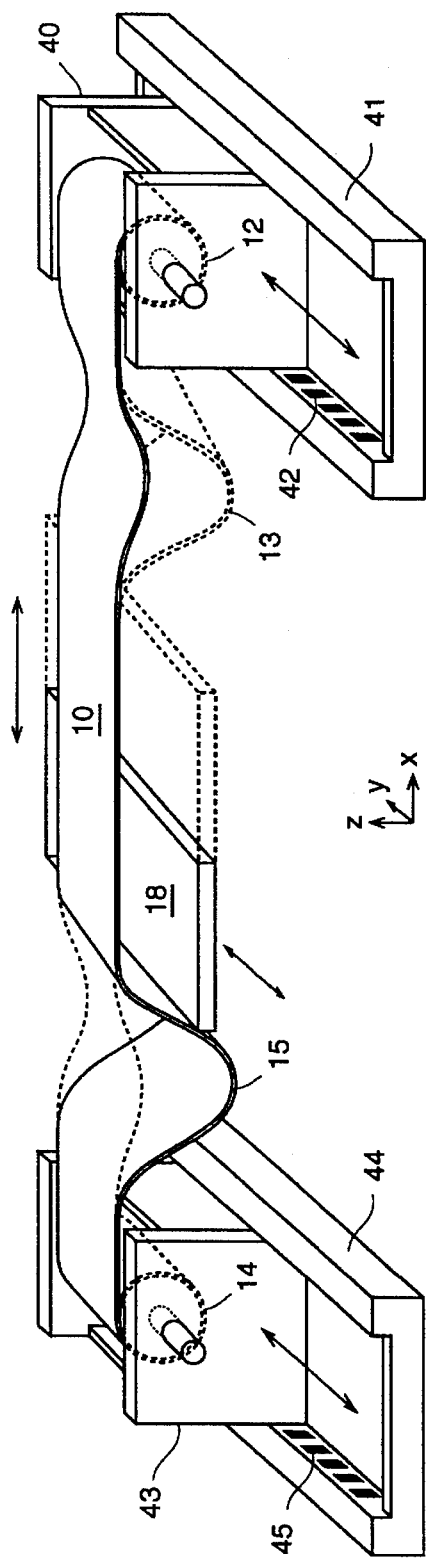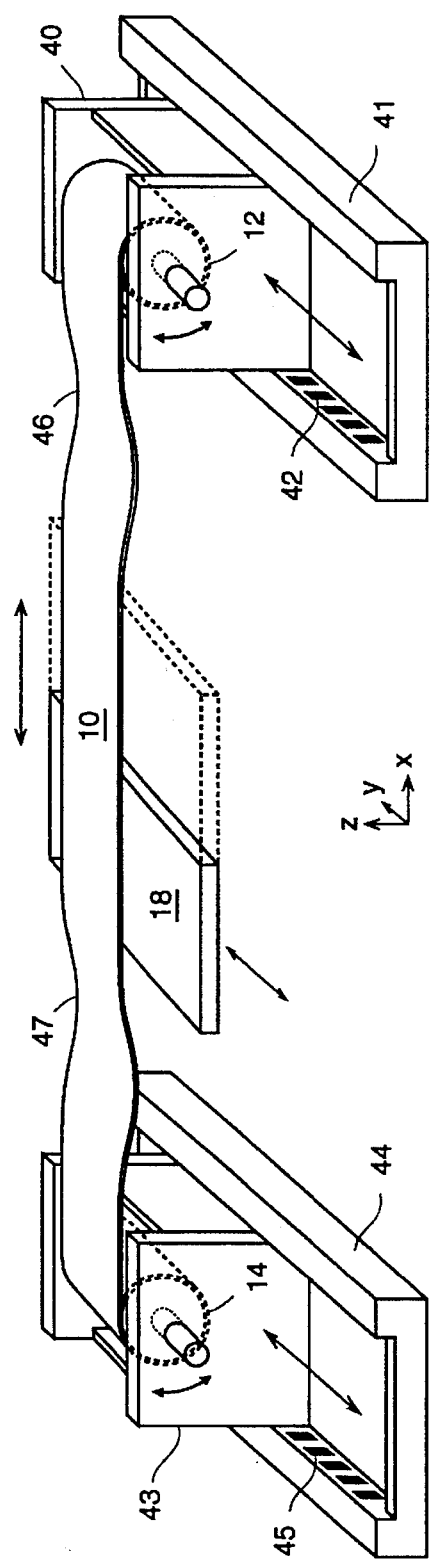

HIGH-THROUGHPUT, HIGH-RESOLUTION, PROJECTION PATTERNING SYSTEM FOR LARGE, FLEXIBLE, ROLL-FED, ELECTRONIC-MODULE SUBSTRATES

FIELD OF THE INVENTION

This invention relates to projection imaging of patterns on very large substrates, and particularly relates to high-throughput, high-precision patterning of a roller-to-roller transported band of semi-flexible substrate material for cost-effective production of electronic modules.

BACKGROUND OF THE INVENTION

Importance of Patterning Tools in Electronic Module Production

In the manufacturing of many electronic modules such as printed circuit boards (PCB's) and multi-chip modules (MCM's), the production equipment represents a major cost element, accounting for approximately two-thirds of the total facility cost. Of the many process steps involved in electronic module fabrication, the most critical are those required for patterning the dielectric and metal layers. The capabilities and cost-effectiveness of the patterning (i.e., lithography) technology impact the performance and cost of the module, and ultimately determine the size and cost at the electronic system level. This makes patterning tools the largest and most critical component of the total production equipment investment. Typical costs of individual tools range between $1.5 and 4 million. A high-volume production facility would have multiple lithography tools. In addition, operating expenses add several hundred thousand dollars per year to the net cost of running such tools. Thus, significant progress will be made toward wider commercial applicability of low-cost electronic modules by development and implementation of new high-throughput, cost-effective patterning equipment.

Roll-to-roll processing is considered an attractive manufacturing technology for further reducing the module cost through naturally simpler automation and reduced overhead. By allowing the material to be processed in continuous rolls, there are fewer opportunities to contaminate or damage the material through handling. Roll-to-roll processing is also an inherently easier process to automate. This cuts down on labor costs and increases the throughput. Finally, roll-to-roll processing introduces very small overhead time to the process cycle. When handling discrete parts in a conventional process, one part must be removed before the next part can be loaded. This is not the case for fabricating electronic module panels with continuous rolls, in which removal of a processed panel from the active region of the equipment can proceed simultaneously with loading of the next panel. The reduced overhead advantage is perhaps the most important in connection with high-speed exposure systems, because, the lower the overhead is, the greater will be the effectiveness of fast exposures in delivering a higher net throughput.

Existing patterning tools for exposing large substrate panels suffer from numerous shortcomings, as described below. Tools that can pattern large, roll-fed sheets with high yields and at a low cost per exposure do not exist. Thus, there is a great need for a roll-to-roll patterning system that can help produce electronic modules cost-effectively.

Current Patterning Technologies

Currently available exposure systems can be classified into four general categories: (a) contact and proximity printing systems, (b) different types of projection systems (conventional, step-and-repeat and scanning), (c) focused-beam direct-writing systems, and (d) holographic imaging systems. Each of these will be briefly described below.

A contact printer for substrate exposure consists of a fixture to align and hold the board in hard contact with the mask which is then illuminated with high-intensity collimated light to transfer the mask image to the board. In a proximity system a uniform gap is maintained between the mask and the board. Most contact printers use one or two mercury arc lamps, powers ranging from below 2 kW to as high as 8 kW. Typically, the radiation used for exposure is in the UV region, from ~250 nm to ~430 nm, the rest of the light in the visible and the infrared being filtered away to minimize heating. The useful UV power represents less than 1% of the total wattage, indicating the extremely poor utilization efficiency of such lamp sources. A major limitation of contact printing is generation of defects on the board due to repeated contacting of the resist-coated surface, which results in lower yields. Frequent mask-board contact also degrades the mask life, which leads to higher overall costs. These problems are somewhat less severe in proximity printing. However, since the resolution R in a proximity system using radiation of wavelength $\lambda$ depends on the mask-substrate gap d, as given by $R=(\lambda d/2)^{1/2}$, any nonuniformity in the gap results in feature size variation. This limitation becomes more severe for larger panels as it becomes more difficult to maintain a uniform gap between the mask and the substrate.

A wide variety of projection imaging systems are routinely used in fabrication of various electronic modules. Conventional, or single-field, projection tools are those in which the image field of the lens is sufficient to accommodate the entire substrate. Typically, a projection lens with a 1:1 magnification is used. For different designed resolutions, the maximum image field size of the projection lens is different. For example, whereas a 1 mil resolution can be obtained over a 4 inch square field, the imageable area for 1 micron resolution must be limited to a field diameter no larger than 2–3 cm. Thus, conventional projection printing systems are limited by the fundamental trade-off between the desired resolution and the largest board they can image.

In a step-and-repeat system the total substrate area to be patterned is broken up into several segments which are then imaged one at a time by stepping the substrate under the lens from one segment to the next. Due to the increased overhead from the stepping, settling and aligning steps for each segment, steppers deliver significantly lower throughput than full-field or scanning projection tools. Most step-and-repeat systems use reduction imaging, typically with a 2:1, 5:1 or 10:1 ratio. Generally, systems with larger reduction ratios provide higher resolution, but also lower throughput. Steppers also have a performance shortcoming due to stitching errors between adjacent exposure segments. When a stepper is used for semiconductor chip lithography, the individual chip sites are separated by unimaged areas ('streets') through which the chips are diced. Since these streets contain no patterns, there is no requirement to precisely stitch adjacent segments together. However, in a large panel, the entire substrate is often one pattern; there are no unimaged areas between segments. The segments, therefore, must be butted next to each other with great precision. Poor lithography due to stitching errors is a significant yield detractor in electronic module production.

Recognizing the throughput limitations of steppers, many different types of scanning projection tools have been developed over the last two decades. The most well known class of scanners uses a reflective ring-field imaging system. Exposures are made by scanning the mask and the substrate across an illumination beam in the shape of an arc, which is necessitated by the geometry of the zone of good image correction. The scanning ring-field imaging concept requires primary imaging mirrors that are approximately three times larger than the size of the substrate. As a result, such scanners, although capable of good resolution, are extremely expensive and incapable of handling most large panel sizes. Their throughputs are also low. Another type of existing scanning tool uses a Dyson optical system in which the mask and substrate are mounted on the two arms of an U-box-shaped stage within which the imaging optical assembly hangs as a cantilever. Such system configurations have severe performance limitations, both mechanically and optically. Their imagery is poor due to Abbe errors and flexural bending, and their throughput is low due to inefficient optical field utilization.

A focused-beam direct-writing system uses an ultraviolet or blue laser in a raster scanning fashion to expose all the pixels, one at a time, on the substrate. The laser beam is focused on the resist-coated board to the desired spot size. The focused spot is moved across the board in one dimension with a motor-driven scanning mirror. In conjunction, the stage holding the board is translated in the orthogonal dimension with a high-precision stepping motor. Simultaneously, the laser beam is modulated (typically, acousto-optically) to be either directed to the desired location on the board or deflected away. Thus, by driving the modulator and the two motors with appropriately processed pattern data, the entire board can be directly patterned. Of the many focused-beam direct-write systems currently available, the offered resolution varies from 0.5–1.0 mil for printed circuit board patterning to under a micron for systems designed for mask-making applications for IC lithography. Since transfer of the pattern information by such tools takes place in a slow, bit-by-bit serial mode, typical substrate exposure times can range from 2 minutes to several hours per sq. ft., depending upon the resolution and the complexity of the pattern data. Direct-write systems, therefore, are suitable only for applications such as mask fabrication and prototyping, and highly unattractive for cost-effective volume manufacturing.

Holographic imaging systems utilize a mask which is a hologram of the pattern to be imaged, such that when "played back", it projects the original pattern onto the substrate. The mask is generated by encoding the diffraction pattern from a standard mask in a volume hologram. Generally, for all but the simplest patterns, fabrication of the holographic mask requires numerous processing steps. In a holographic lithography system, the burden of imaging is placed entirely on the mask. Holographic imaging systems suffer from poor diffraction efficiency and are applicable, at best, for imaging of very periodic patterns of not very high resolution. If the pattern is not periodic, the imaging resolution degrades. Holographic masks are also considerably more expensive to generate, which is made further prohibitive when masks for many different layers are required for the substrate.

Related Prior Art

Large-area exposure systems that eliminate all of the above limitations have been described by this inventor in his previous patents, including: U.S. Pat. No. 4,924,257, Scan and repeat high-resolution lithography system, issued May 8, 1990; U.S. Pat. No. 5,285,236, Large-area, high-throughput, high-resolution projection imaging system, issued Feb. 8, 1994; and U.S. Pat. No. 5,291,240, Nonlinearity-compensated large-area patterning system, issued Mar. 1, 1994. In these patents, the inventor has described exposure systems that can pattern large substrates by an efficient seamless scanning technique. The illumination system is designed to produce a hexagonal exposure region. Seamless joining of scans is achieved by partial overlap between adjacent scans, which produces a uniform exposure of the entire panel due to integration of complementary intensity profiles. The systems described in these prior patents are attractive for patterning substrates which are in the form of rigid, discrete panels, but are unable to handle flexible substrates which are in the form of a continuous sheet-roll fed from one roller and taken up by another roller after exposure. As already pointed out above, a system that provides the capability to pattern substrates in a roll-to-roll process will be a significant advantage in the manufacturing of electronic modules. This invention describes such a system.

SUMMARY OF THE INVENTION

This invention describes a projection imaging system that can pattern very large, flexible substrates at very high exposure speeds and any desired image resolution, the substrates being in the form of a band, roll fed from a supply roller, for very cost-effective manufacturing of a variety of electronic modules. From the continuous roll substrate, a segment the size of one panel is exposed at a time in the patterning system; after exposure the segment is made to exit from the patterning system, the next segment is fed and exposed, and so on. The segment being exposed is held rigidly on a scanning stage, on which is also mounted a mask containing the pattern to be formed on the substrate. The mask is imaged onto the substrate by a 1:1 projection system which is stationary and situated above the scanning stage. The mask is illuminated from below with a hexagonal illumination beam which causes a patterned region of similar shape to be imaged on the substrate. The stage is programmed to scan the mask and substrate simultaneously across the hexagonal regions so as to pattern one whole panel. Suitable overlap, between the complementary intensity profiles produced by the hexagonal illumination configuration, ensures seamless joining of the scans.

Additional important elements of this patterning system include the mechanisms for handling the roll substrate. The key requirement in the design of these mechanisms is that, on the one hand, the segment (panel) being exposed must be held rigidly on the stage and be free to move in two dimensions with the scanning stage; and on the other hand, the segment must be part of a continuous roll and the mechanism must be able to feed and extract the roll material into and from the rigid stage one panel-size at a time without impacting the integrity of the sheet. This invention describes several embodiments for accomplishing these requirements.

It is thus the object of this invention to provide a high-throughput, high-resolution, projection patterning system for large, flexible, roll-fed, electronic-module substrates.

It is another object of the invention to provide an exposure system that images large substrates by overlapping seamless scanning using a small-field projection system and a single planar stage assembly.

It is a more specific object of this invention to provide mechanical transport systems that enable both rigid mounting of a flexible substrate during two-dimensional scanning exposure, and supply and take-up of the flexible roll substrate without interfering with the scanning or damaging the mechanical integrity of the substrate.

A feature of the invention is a functionally integrated implementation of an illumination means to produce a uniform hexagonal illumination, a two-dimensional scanning stage to enable seamless exposure of large substrates, and means to feed and mount flexible substrates on the scanning stage.

Another feature of the invention is the provision of synchronous rotary motions of the supply and take-up rollers of the flexible substrate material, also synchronized with the longitudinal scanning motion of the single planar stage, such that the movements of the rollers and that of the stage are mutually non-interfering.

Another feature of the invention is the provision of certain slack lengths of the flexible substrate on both sides of the scanning stage to permit stage movements without interference with the supply and take-up rollers.

Another feature of the invention is the provision of a mechanism for synchronized stepping of the substrate rollers in a lateral direction to permit lateral motions of the stage without damaging the flexible substrate.

Still another feature of the invention is the provision of a transport configuration for the supply and take-up of the roll material so as to enable interference-free scanning by the stage and yet require small overall floor space.

An advantage of the invention is that it provides the capability of patterning very large substrates with very high throughputs and any desired resolution, thus eliminating the limitations of existing patterning tools.

Another advantage of the invention is that it provides the ability to pattern large substrates in the form of a continuous roll at very high exposure speeds, without interference between the exposure and substrate handling mechanisms, thereby significantly lowering the cost per exposure of the electronic module.

While the invention has been presented in embodiments incorporating the features described above, other objects, features and advantages of the invention will be apparent to those skilled in the art from the written description and claims and the attached drawings.

DRAWINGS AND TABLES

FIG. 1 presents a generalized schematic illustration of a high-throughput, large-area, roll-to-roll patterning system, showing a projection assembly, an illumination assembly, a scanning stage, a flexible substrate fed from one roller and taken up on another roller, and a segment of the substrate held rigidly on the stage for exposure.

FIG. 8 illustrates an embodiment of the invention in which the scanning motion of the stage in the x-direction is accommodated by slack regions in the substrate and the stepping movements of the stage in the y-direction are accommodated by enabling the rollers to slide simultaneously under control of suitable motors.

FIG. 9 illustrates an embodiment of the invention in which the scanning motion of the stage in the x-direction is accommodated by enabling the rollers to rotate around their axes synchronously and the stepping movements of the stage in the y-direction are accommodated as in FIG. 8. Thus, the need for having slack regions in the substrate is almost entirely eliminated.

Figure 10:
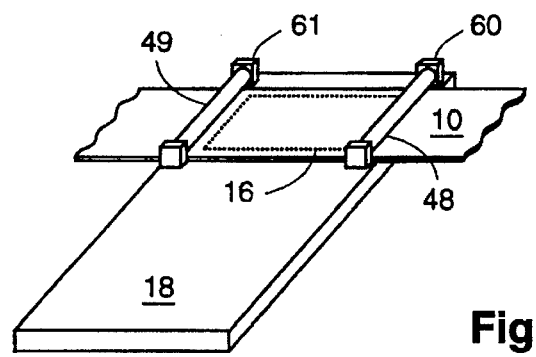

FIG. 10 shows a detail of the substrate transport mechanism at the stage. After a segment is exposed, it is moved away by rubber platens and replaced by another segment. The platens are turned by motors under command from system control signals; they are light in weight and move as an integral part of the stage.

Figure 11:
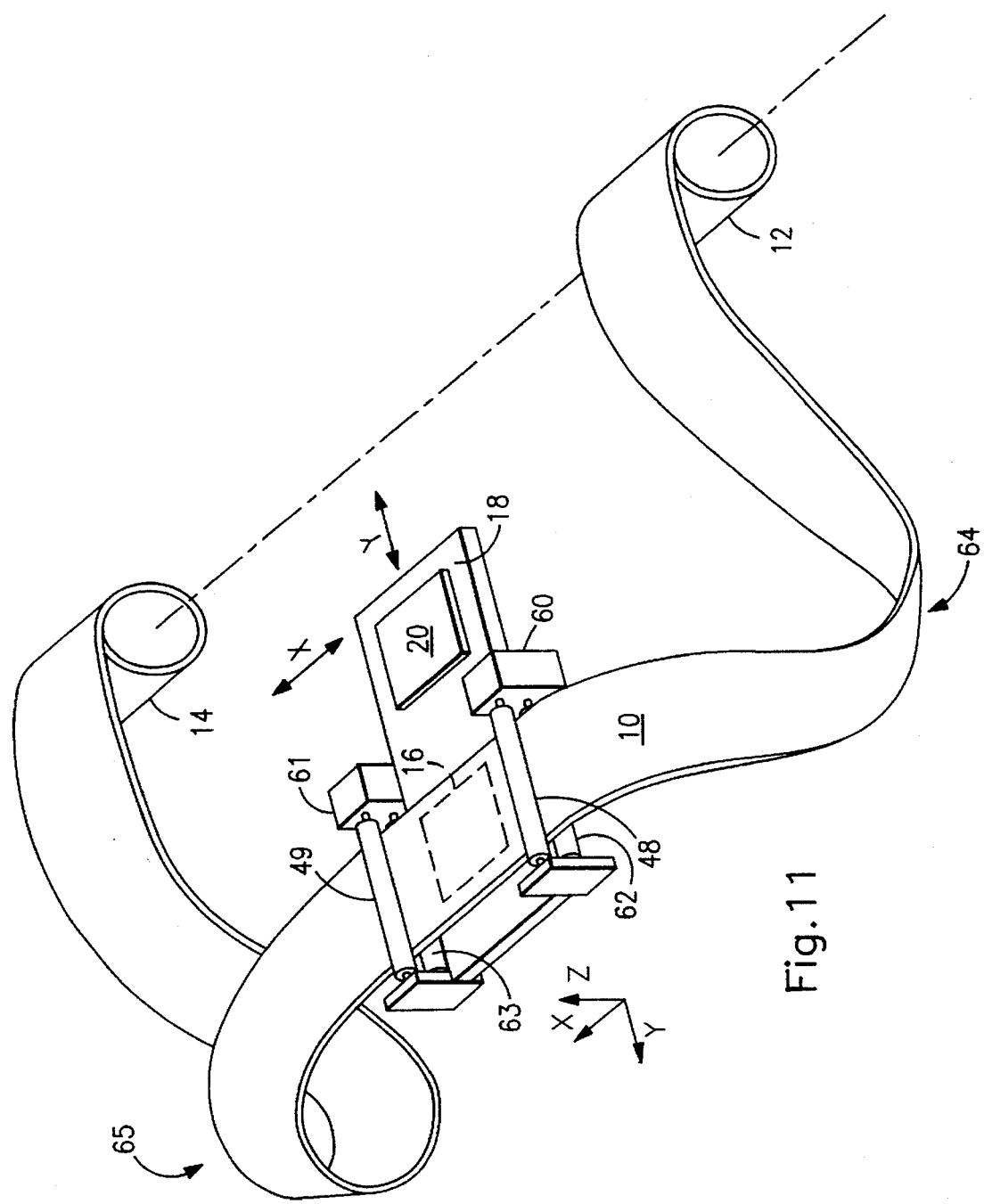

FIG. 11 illustrates an embodiment of the invention in which uninhibited, two-dimensional movement of the substrate segment being exposed is made possible by provision of direction-changing slack regions in the substrate roll, such that neither turning of the supply and take-up rollers nor sliding of the rollers simultaneously with the stage movements is necessary.

Figure 12:
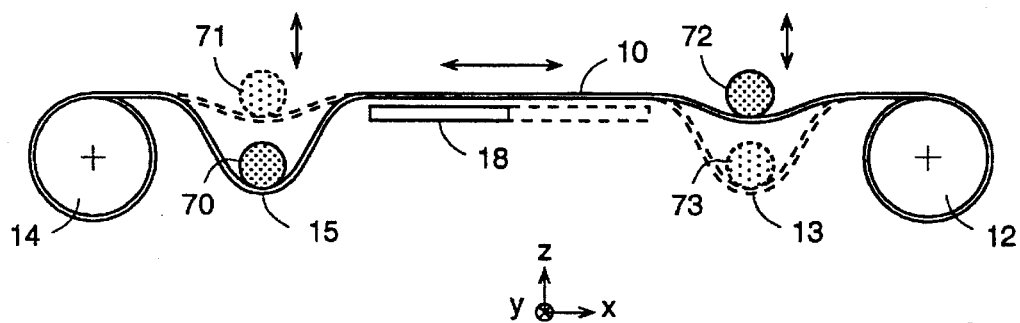

FIG. 12 illustrates how a set of light-weight, movable, auxiliary rollers can be incorporated in the system to manage and guide the movement of the slack regions of the substrate, thereby minimizing the possibility of wrinkle-damage to the substrate roll.

Figure 13:
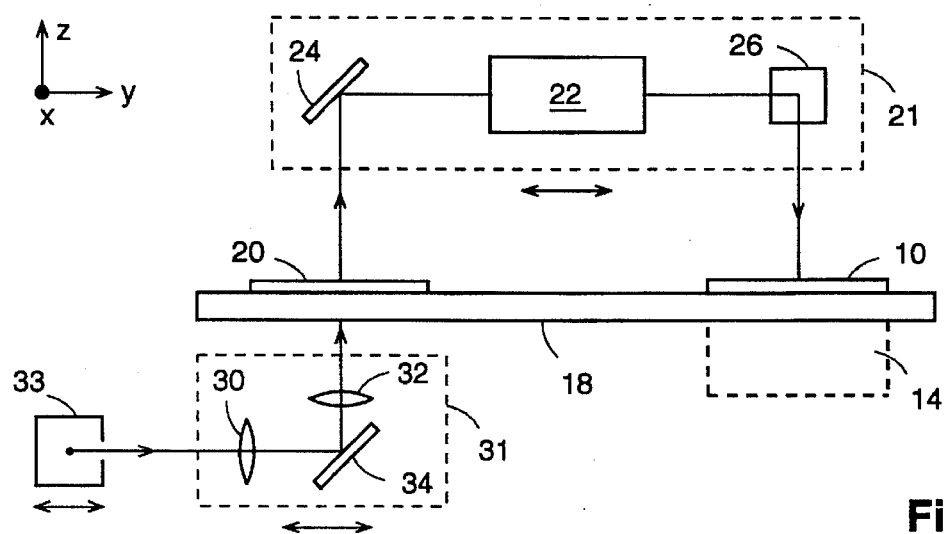

FIG. 13 illustrates an embodiment of the invention in which the multiple exposure scans of the substrate are generated by moving the imaging and illumination optics.

Table 1 presents the design specifications and estimated throughput of a roll-to-roll patterning system designed as an example based on the invention.

TABLE 1

| Imaging Concept | Seamless scanning projection |
| --- | --- |
| Resolution | 10 microns |
| Projection System | 1:1 magnification refractive lens |
| Numerical Aperture | 0.0216 (f/23.2) |
| Depth of Focus | 660 microns |
| Lens Image Field Size | 50 mm diameter |
| Width of Substrate Roll | 13.3 inches |
| Panel Exposure Area | 12.5 × 12.5 inches |
| Illumination Source | XeCl excimer laser |
| Illumination Wavelength | 308 nm |
| Overlay Precision | 3 microns |
| Alignment System | Automatic |
| Panel & Mask Handling | Automatic |
| Throughput | For 12.5 × 12.5 inch panels: |
| 10 sec Overhead, 150 W Source | 188 panels/hr (3.4 sq. ft./min) |
| 5 sec Overhead, 200 W Source | 304 panels/hr (5.5 sq. ft./min) |

DETAILED DESCRIPTION OF THE PREFERRED EMBODIMENTS

Figure 1:
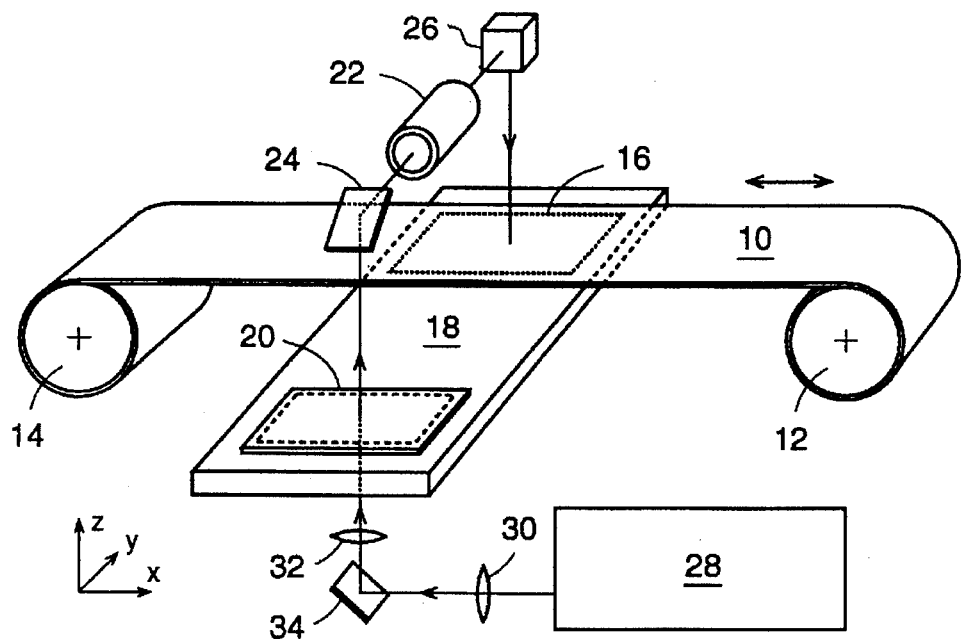
Figure 2:
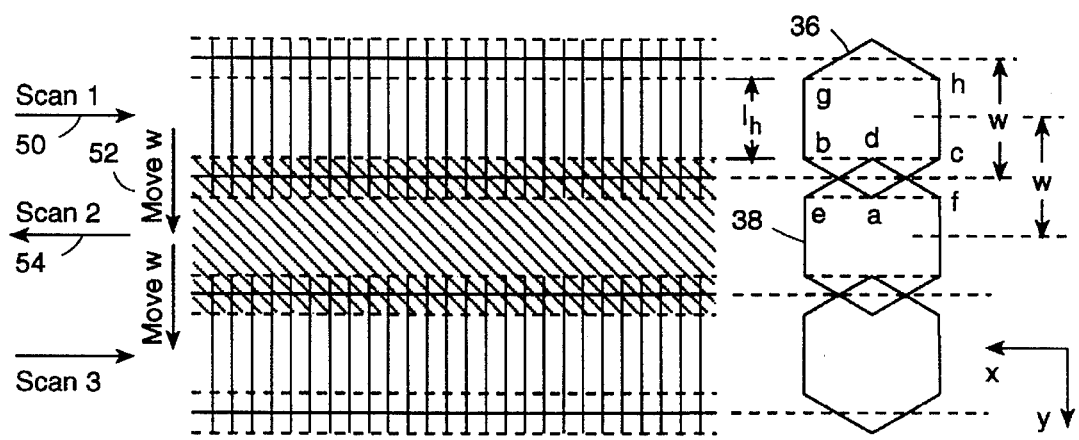
FIG. 2 illustrates the seamless scan-and-repeat mechanism, showing three adjacent scans generated by overlapping hexagonal illumination beams and the complementary exposure in the overlap regions which generate the seamless transitions between adjacent scans. The figure also shows the scan direction alternating between +x and −x, and the lateral movements by w between scans.

FIG. 1 presents a simplified schematic of the roll-to-roll patterning system. It illustrates those features of the invention which are applicable to all embodiments to be described in detail in the following. Features which are specific to a particular embodiment will be discussed in the context of the relevant embodiment. 10 represents the flexible substrate which is supplied from supply roller 12 and, after exposure, taken up on take-up roller 14. The exposure system exposes one segment, 16, of the size of one panel, at a time. The segment 16 of the flexible substrate is rigidly held on a scanning stage 18 by vacuum; this is further discussed below with reference to FIG. 3. On the stage 18 is also mounted a mask 20 which contains the pattern to be produced on each substrate panel, such as 16. The mask pattern is imaged by a projection lens 22 on to the substrate panel 16. The optical imaging path also contains a fold mirror 24 and a reversing unit 26. The projection lens 22 is a refractive lens system, and the reversing unit 26 ensures that the orientation of the image on the substrate is the same as that of the pattern on the mask. The mask is illuminated from below by an illumination system 28, which would typically comprise a light source and additional optical units and components for beam shaping, uniformizing and turning. The output of the illumination system 28 is delivered to the mask 20 after further processing by lenses 30 and 32 and mirror 34, leading to uniform illumination of a hexagonal region on the mask The seamless scanning exposure mechanism has been described in detail in this inventor's previous patents cited above, and is summarized here with the illustration of FIG. 2. The single planar stage 18 (FIG. 1) causes the mask 20 and the substrate segment (panel) 16 to scan in unison along the x-axis across their respective illuminated regions to traverse the length of one panel. The stage then moves along the y-axis by an effective scan width (shown as w, 52, in FIG. 2). Now the substrate and mask are again scanned along x as before, after which they are laterally moved along y, and the process is repeated until the entire panel is exposed. In FIG. 2, the hexagons 36 and 38 represent the illuminated regions on the substrate for scans 1 (50) and scan 2 (54). The y-movement after each x-scan is given by w=1.5 $l_h$, where $l_h$ is the hexagon side-length. In scan 1, the region swept by the rectangular portion b-g-h-c of hexagon 36 is not overlapped by any portion of scan 2. However, the region swept by the triangular segment a-b-c of hexagon 36 in scan 1 is re-swept in scan 2 by the triangular segment d-e-f of hexagon 38. When the doses from these triangular segments are integrated, the cumulative exposure dose anywhere in the overlapping region is the same as in the non-overlapping regions, thus producing a seamless, uniform exposure over the whole panel.

Figure 3:
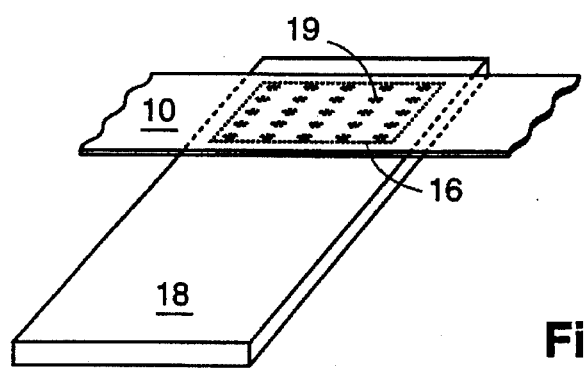
FIG. 3 is a detailed illustration of the vacuum mounting of a segment of the substrate roll on the scanning stage. The vacuum ports are small enough to prevent buckling of the substrate, and numerous enough to keep the substrate segment flat.
Figure 4:
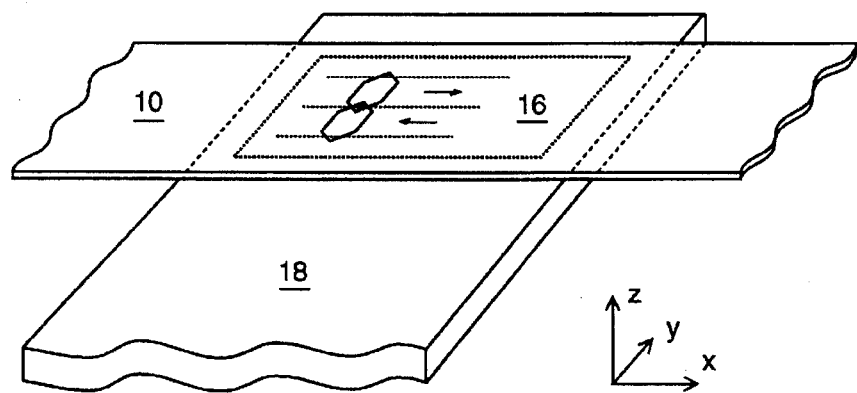
FIG. 4 is a close-up view of two overlapping hexagonal scans on the substrate segment being exposed.

The description above has illustrated how the patterning system concept using hexagonal seamless scanning enables the designer to deliver the desired resolution over very large substrate areas efficiently, provided the substrate being exposed is a discrete, rigid panel. We now show how to construct a patterning system that achieves the above objectives when the substrate is flexible and is fed from a continuous roll. Returning to FIG. 1, after a segment 16 of the roll 10 is positioned on the stage 18, it is held firmly by vacuum, as shown in FIG. 3. Stage 18 is constructed with several vacuum ports, such as 19, in the region where a substrate segment is to be held. These ports are sufficiently small in size to ensure that the vacuum grip does not cause dimpling of the substrate, and they are large enough in number to keep the entire segment flatly mounted on the stage. Exposure is made by scanning the substrate along the x-axis several times, while stepping it by the effective scan width between successive scans, as described above and further illustrated in FIG. 4. To permit the scanning and stepping movements, the following mechanisms are implemented in the patterning system.

Figure 5:
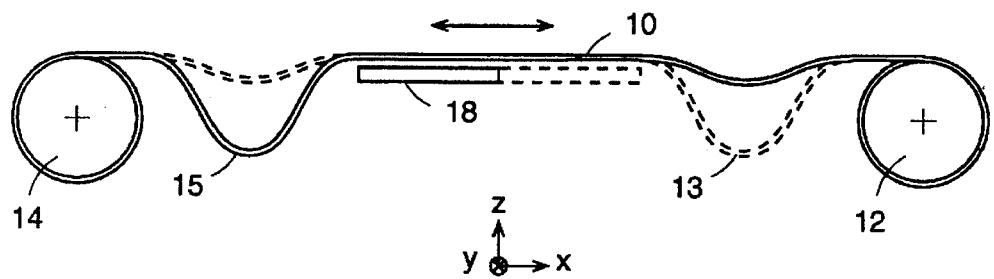
FIG. 5 depicts lengths of slack regions in the substrate roll and illustrates how the slack length on one side of the scanning stage increases while that on the other side decreases, thus permitting uninhibited movement of the stage in longitudinal direction without interfering with the continuous nature of the substrate material.
Figure 6:
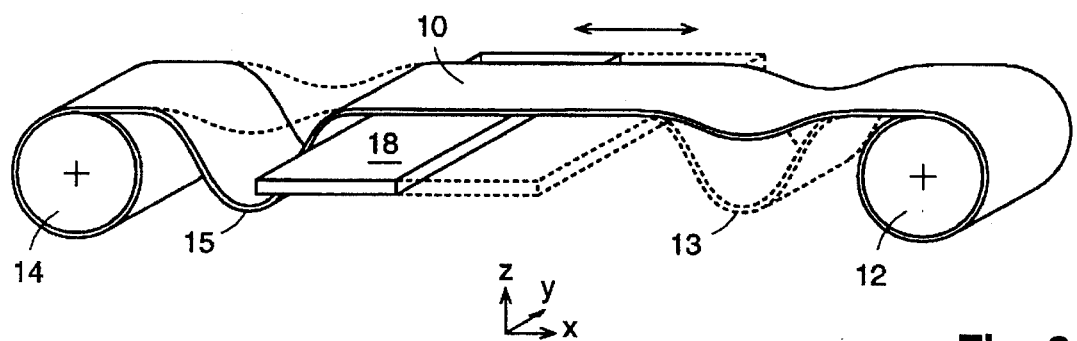
FIG. 6 is a three-dimensional perspective view of the illustration of FIG. 5.
Figure 7:
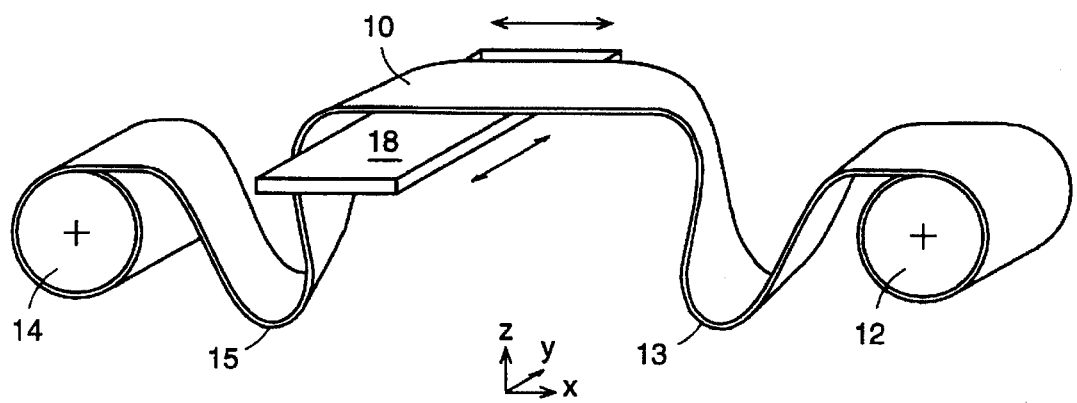
FIG. 7 depicts how the stage is provided the ability to move without interference in both x- and y-directions by designing in suitable lengths of the slack regions.

The simplest mechanism for handling the continuous flexible substrate in the patterning system is shown in FIGS. 5 and 6. Here, in the flexible substrate roll, certain lengths of slack are introduced in the x-direction on both sides of the scanning stage. These slack lengths are shown as 13 and 15 in FIGS. 5 and 6. As the stage 18 scans along the positive x-direction, the slack 13 increases and the slack 15 decreases; when the stage scans along the negative x-direction, the slack 13 decreases and the slack 15 increases. Thus, the slack lengths in the substrate material permit uninhibited scanning movement of the stage without interfering with the rollers. Additionally, the slacks 13 and 15 are designed to be of suitable lengths so that they also permit uninhibited stepping movement of the stage in the y-direction without causing wrinkling that may damage the mechanical integrity of the substrate; this is illustrated in FIG. 7.

A second embodiment of the high-throughput roll-to-roll patterning system is illustrated in FIG. 8. It comprises a mechanism that enables linear movement of the supply and take-up rollers (12 and 14) in a lateral direction (i.e., along the y-axis), such movement being synchronized with the stepping of the scanning stage 18 that takes place between successive x-scans. The supply roller 12 is housed in supply roller assembly 40 which is capable of moving in the slide 41 under the control of a drive mechanism 42 (which, e.g., can be a linear motor). Similarly, the take-up roller 14 is housed in take-up roller assembly 43 which is capable of moving in the slide 44 under the control of a linear motor 45. Thus, after each scan in the x-direction, as the scanning stage 18 steps in the y-direction by a distance equal to the effective scan width (shown as w in FIG. 2), both the supply and take-up roller assemblies 40 and 43 move synchronously in the y-direction by the same amount. The scanning motion of the stage 18 in the x-direction is facilitated, as shown previously in FIGS. 5 and 6, by provision of the slack lengths 13 and 15. It is clear that an advantage of the embodiment of FIG. 8 is that at no time does one portion of the roll material move laterally with respect to the rest. Thus, no additional slack lengths are required to accommodate the y-axis motion of the stage, and the risk of damaging the substrate material by wrinkling is significantly reduced.

Another embodiment of the invention is shown in FIG. 9. In this system configuration, the supply and take-up rollers 12 and 14 are provided with the capability of turning around their respective axes in synchronism with the x-direction scanning of the stage 18. Specifically, as the stage moves in the positive x-direction, the supply roller 12 turns clockwise to take up the slack (13 in FIG. 8) that would otherwise be generated; and in synchronism, the take-up roller 14 also turns clockwise to release the extra length of the substrate material that would have otherwise been given by the slack 15 in FIG. 8. When the stage 18 moves in the negative x-direction, both rollers turn counter-clockwise, the roller 12 releases the necessary additional material, and the roller 14 takes up the released material. The motion of the stage 18 in the y-direction is accommodated, as in the embodiment of FIG. 8, by the provision of y-movement of the roller assemblies 40 and 43 in their respective slides 41 and 44. The major advantage of the embodiment of FIG. 9 is that the stage is able to move unimpeded in both x- and y-directions without requiring the substrate roll to have any slack lengths, thus eliminating the possibility of any mechanical damage due to wrinkling. Even so, it is beneficial to provide small slack regions in the material, shown as 46 and 47 in FIG. 9—by so doing, one requires very low level of precision in the rotation controls of the rollers 12 and 14 and their synchronism with the high-precision scanning stage 18. The net result is a lowering of the system cost without compromising its performance.

In all of the embodiments discussed above (FIGS. 6–9), a further refinement may be added by incorporating substrate advancing platens, shown as 48 and 49 in FIG. 10. These platens have a rubber-like surface with sufficient friction to advance the roll material 10 precisely without slippage, and is similar to the surface of commonly used platens in typewriters, copiers, printers, plotters, etc. After exposure of a segment 16 is completed, the platens turn clockwise to advance the roll substrate to the left so as to bring the next segment of the roll on to the stage for exposure. The platens turn under control commands from motor drives 60 and 61; these commands come from the overall system control, and may be synchronized with other mechanisms—for example, in the embodiment of FIG. 9, with the rotary movements of rollers 12 and 14.

We now describe an embodiment in which the roll substrate material has such a path that the scanning stage is free to move both longitudinally and laterally without requiring the supply and take-up rollers to either turn or slide simultaneously. This embodiment is illustrated in FIG. 11. As before, the substrate material 10 is supplied by supply roller 12, a segment 16 of it is mounted on state 18 for exposure, and taken up by take-up roller 14. The difference in this embodiment is that between each roller and the stage, the substrate material makes a partial loop and changes its direction of transport by 90 degrees. These partial loops are shown as 64 and 65 in FIG. 11. Note that the axes of the rollers 12 and 14 are now along the longitudinal scan direction of the stage 18 (x-axis), whereas in the previous embodiments, they were in the lateral direction (y-axis). It can be readily observed in FIG. 11 that the partial loops 64 and 65 permit free movement of the stage 18 along both x- and y-directions, without requiring the rollers 12 and 14 to either turn or move along their axes. After a segment 16 has been exposed, its vacuum grip to the stage 18 is released, and the advancing platens 48 and 49 are turned by their respective motors 60 and 61 which receive control signals to advance the roll material 10 across the stage by the length of one segment. During this segment-advancing step, the supply roller 12 releases the necessary length of material, and the take-up roller 14 winds up an equal amount. The advancing platens 48 and 49 may either use the stage itself as the backing surface for the roll material, as in FIG. 10, or may work in conjunction with additional platens 62 and 63, as shown in FIG. 11. Note that in order to release new substrate material, roller 12 turns counter-clockwise (with the x-axis pointing toward the observer), whereas roller 14 turns clockwise to wind up exposed material; thus, the two rollers have independent turning axles. Alternatively, the rollers can be turned by a common axle by either releasing new substrate material from the underside of roller 12, or winding up exposed material from the underside of roller 14.

In all of the above embodiments, the regions of slack in the flexible material are permitted to maneuver themselves freely as the stage moves. Specifically, such is the case with regions 13 and 15 in FIGS. 5–8 and regions 64 and 65 in FIG. 11. As an alternative, the movement of these slack regions could be managed and guided by auxiliary rollers which are light-weight and movable along the path of movement of the slack regions. An example is illustrated in FIG. 12, which re-depicts the embodiment of FIG. 5 with the addition of the auxiliary rollers just discussed. When the stage 18 is in its left-most position, these auxiliary rollers are denoted here as 70 and 72; when the stage is in its right-most position, the rollers are in positions shown as 71 and 73. In the embodiments of FIGS. 5, 6 and 8, the auxiliary rollers are capable of moving in a single vertical plane (the x-z plane), whereas in the embodiments of FIGS. 7 and 11, they also have the ability to move in and out of the x-z plane as well as to tilt in order to accommodate the two-dimensional turnings of the slack regions 13 and 15.

As an alternative to the single planar stage 18 shown in the embodiment of FIG. 1, we can use a dual-platform stage in which the mask is mounted on one platform and the substrate segment being exposed on the other platform. The imaging subsystem is situated between the two platforms and the mask is illuminated from the outer side of the dual-platform stage. The two platforms of the stage can be parts of an integrated assembly which is scanned as a unit, or they can be independent stages which are scanned synchronously. All other aspects of the patterning system, namely the hexagonal illumination with partial overlap, the seamless scanning exposure, and the flexible substrate handling, remain the same as in embodiments already described.

Finally, we describe how the scanning exposure of the substrate can be accomplished by scanning the light rays and the optics rather than the stage. FIG. 13 illustrates such an embodiment. The geometrical orientation of the system and its various components in FIG. 13 should be carefully observed, especially noting that the plane of the paper is the y-z plane, whereas in FIGS. 1, 4–9 and 11, the paper is in the x-z plane. The imaging assembly, comprising lens 22, fold mirror 24 and reverser 26, is shown in aggregate as 21. The condenser assembly, comprising lenses 30 and 32 and mirror 34, is denoted in aggregate as 31. In addition, there is a fold mirror 33 in the path of the incident laser beam, which enters the system along the x-axis. To carry out an exposure scan in the x-direction, the imaging assembly 21, the condenser assembly 31 and the mirror 33 are scanned simultaneously along x, keeping the stage 18 stationary. To position the substrate for the next x-scan, the imaging assembly 21 and the condenser assembly 31, but not mirror 33, are stepped along y by the effective scan width (w in FIG. 2), again keeping the stage 18 stationary. This embodiment thus eliminates any movement of the substrate during the exposure of one panel segment; the price one pays is added complexity of optical design and large number of moving optical components.

In summary, we have described above several embodiments of a novel, high-throughput, roll-to-roll patterning system that is capable of imaging large, flexible substrates at a low cost of exposure per unit area. The numerous advantages of the system of this invention over prior-art lithography tools can be summed up as follows:

(i) Being a projection system, it circumvents the traditional problems of contact printing tools, namely defect generation on the panel (hence yield loss), and degradation of the mask (hence higher costs). It also eliminates the shortcomings of proximity printing tools, namely, limited resolution and feature size variations.

(ii) With its unique exposure field and continuous scanning movement, the disclosed system enables patterning of substrates of practically any desired size, eliminating field size constraints of conventional projection tools.

(iii) With its seamless overlap between adjacent scans, critical stitching errors which are characteristic of conventional step-and-repeat tools, are eliminated. The scanning exposure concept also minimizes the non-exposure overhead time responsible for significant throughput limitation in steppers.

(iv) Due to its 'batch' exposure mode, it eliminates the severe throughput limitations of direct-write systems which expose pattern pixels in a serial fashion.

(v) With its hexagonal illumination configuration, the system of this invention provides maximum field utilization and very high scanning efficiency, enabling it to deliver high throughputs using small-size optics modules, thus keeping system costs low.

(vi) Anvik's modular system design concept permits rapid construction of the exposure system in different user-specified configurations, without requiring an entire new development program for each configuration.

(vii) The modular design concept also provides upgradability. Unlike in prior-art lithography tools, since the major subsystems (illumination, imaging, stage, alignment) in this system are mutually non-interfering, performance can be taken to a higher level by upgrading the appropriate module, without having to retool completely.

(viii) By enabling very short exposure times, the system allows full throughput benefits to be realized from the significantly lower overhead time in roll-to-roll processing. In other patterning tools where the exposure times are significantly greater, the benefit of low overhead time in roll-to-roll processing is lost.

(ix) The system described in this invention is highly versatile. By using an excimer laser as a light source, it provides high-throughput capability for patterning of a variety of photoresists as well as via formation in both photosensitive and photo-ablative dielectrics, thus lowering capitalization costs in a manufacturing plant.

Method of Operation

The invention describes a method of providing a high-throughput, high-resolution patterning system for large, roll-fed substrates using the following steps:

1. Providing a stage for holding both a panel-size segment of the substrate roll and a mask, and capable of scanning longitudinally in one direction, and also capable of moving laterally in a direction perpendicular to the scan direction;

2. Providing an illumination system which produces radiation of the wavelength and intensity required by the photosensitive substrate material, and which produces on the mask an illumination region in the shape of a regular hexagon of side $l_h$ which can be inscribed within the image field of the projection assembly described in step 3 below;

3. Providing a projection imaging assembly of magnification 1:1, which has an image field size which is substantially smaller than the size of a panel-segment of the substrate, and which is designed to produce a 1:1 image of the illuminated region of the mask on the substrate with the required resolution;

4. Providing an optical reversing unit which, in conjunction with the projection assembly of step 3, helps produce an image on the substrate that is in the same orientation as the object pattern on the mask;

5. Providing rollers to supply and take up flexible substrate material in the form of a band of a sheet, and providing mechanisms to affix a panel-segment of the substrate on the stage so as enable the stage to move both longitudinally and laterally without damaging any portion of the roll-to-roll substrate;

6. Scanning the stage so that the length of the mask traverses across the hexagonal illumination region described in step 2;

7. Stopping the stage momentarily after completion of a scan across the length of the mask, moving the stage by a distance equal to 1.5 $l_h$ in a direction perpendicular to the scan direction, and resuming the scanning of the stage in a direction opposite to the scan direction in step 5;

8. Repeating steps 6 and 7 until exposure of one entire panel-segment of the substrate is completed;

9. Releasing the exposed panel-segment of the substrate from the stage, releasing an equal length of substrate from the supply roller, affixing another panel-segment of the substrate on the stage, winding up an equal length of substrate on the take-up roller, and repeating steps 6–8 above until exposure of the entire new panel-segment of the substrate is completed; and 10. Repeating steps 6–9 above until exposure of the whole roll of substrate material is completed.

For additional precision in patterning, the method of operation may further include the step of periodically realigning the mask and substrate with respect to each other during the steps 6–10 above.

System Design Example

In this section, we present an example of a system design based on this invention. We describe the design parameters, both optical and mechanical, for the system, and also discuss the hardware subsystems suitable for incorporating in the tool. The projection assembly is a refractive lens with a magnification of 1:1. It has a numerical aperture (NA) of 0.0216 (f/23.2) which provides a resolution of 10 µm, more than adequate to meet the linewidth requirement of 15 µm for the next several years for electronic modules made on flexible substrates. In fact, it is always desirable to have an optical design resolution better than the minimum feature size to be patterned; this gives both a comfortable manufacturing process window and good line-edge definition. The imaging system has a depth of focus of 660 µm. This will comfortably accommodate the flatness tolerance of 125 µm typical of most flexible substrates. The projection lens has an image field of 50 mm diameter and is made of all fused silica elements. The light source is a xenon chloride excimer laser operating at a wavelength of 308 nm with an average power output of ≧150 W. The choice of an excimer laser as the light source as contrasted with a mercury arc lamp is based on the fact that the optical efficiency for the useful UV power delivered to substrate is significantly greater for the laser (50–60%) than for the lamp (<2%).

The x-y scanning stage system is designed to handle substrate widths of up to 14 inches. This single planar stage holds the mask and the substrate side-by-side; the mask is held mechanically and the to-be-exposed segment of the substrate by vacuum. The stage is of the crossed roller bearing type with linear motor drives, with position and velocity control being provided by linear encoders. Other optical modules in the exposure tool include a condenser subsystem, which comprises an input lens assembly for beam shaping and focusing, an intensity homogenizer, a relay lens assembly, and some steering mirrors. Additional components in the imaging optical train include a reversing unit and a folding mirror. The homogenizer employs a multiple-reflection light tunnel configuration. The reversing unit is be a split-roof mirror system. All mirrors in the system are high-reflectivity, multilayer dielectric-coated mirrors. All lens-element surfaces have anti-reflection dielectric coatings. The exposure tool also incorporates a view and focus system and an automatic alignment system based on capturing mask and substrate targets in a vision system. Handling of the roll-fed substrate is automated for initialization, alignment and scanning exposure, with integrated control provided from a personal computer. The overall specifications of the system example are summarized in Table 1.

Throughput Estimate

To demonstrate the attractive throughput of the patterning system of this invention, we present the following analysis based on realistic parameters. We use the projection lens assembly described above, with its design resolution of 10 μm and an image field diameter of 50 mm. Referring to FIG. 2, the length of a side of the hexagonal exposure field, $l_h$, is half of the image field diameter. Thus, $l_h = 25$ mm.

The effective scan width w, as defined previously, is then $w = 1.5 \, l_h = 37.5$ mm.

If the scan speed is $v_x$, then the raw exposure throughput (i.e., without taking into account any non-exposure overhead time), defined as the area A exposed per unit time, is given by $A = w \, v_x$.

The appropriate scan speed is determined by the resist sensitivity and the available exposure intensity on the substrate. We use a resist sensitivity of $D_s = 500$ mJ/cm$^2$, with the remark that many commonly used resists in representative thicknesses are often exposed with lower doses. To estimate the UV power incident on the panel, we use a conservative value of η=50% for the net optical efficiency of the optical train. This gives a value of 37.5 W for the power incident on the panel. For the above combination of hexagonal image field size, resist sensitivity and incident power, the stage can be used at speeds up to 40 cm/sec. The raw exposure throughput then can be estimated to be $A = 150$ cm$^2$/sec $= 9.7$ sq.ft/min.

The final important parameter that enters the throughput calculation is $t_{oh}$, the total overhead time per panel, which includes the load, unload and alignment times. Using $t_{oh}=10$ sec, a patterned area of 12.5×12.5 inches per panel, and a scanned exposure area of 380×360 mm per panel (which is larger than the patterned panel area to allow for stage acceleration and deceleration, and margins), the net throughput can be estimated to be $W = 188$ panels/hr, or 3.4 sq. ft./min.

A major advantage of roll-to-roll processing is that it cuts down the load-unload overhead time. If we use a $t_{oh}$ value of 5 sec, then, with a 200 W laser, the net throughput will be $W = 304$ panels/hr, or 5.5 sq. ft./min.

We remark that these throughput figures are several times greater than those possible with currently available tools. In addition, note that the system of this invention is also capable of high-throughput via generation, both in photosensitive and photo-ablative dielectric materials.

I claim:

1. A large-area, high-throughput, high-resolution, scan-and-repeat projection imaging system for replicating patterns present on a mask onto each of a sequence of segments (16) of a substrate band (10) characterized by (a) a stage subsystem (18) comprising locking means for the mask (20) and locking means for a segment (16) of the substrate band (10) providing fixed juxtaposition of the mask (20) relative to the substrate band segment (16), said stage subsystem (18) being capable of scanning in one dimension, and when not scanning in that dimension, capable of moving laterally in a direction perpendicular to the scan direction so as to position itself for another scan; said stage subsystem (18) thus being capable of exposing a full segment (16) of the substrate band (10) by breaking up the substrate band segment (16) area into a certain number of parallel strips, and exposing each of said strips by scanning the length of the strip across a fixed illumination region;

(b) an illumination subsystem (28–34) having the wavelength and intensity distribution characteristics suited for exposure of said substrate band (10), having an effective source plane of a predetermined shape, and capable of illuminating on said mask (20) a region of said predetermined shape;

(c) a projection subsystem (22–26) for imaging said illuminated region of said predetermined shape through the mask onto the substrate, having an object-to-image magnification ratio of substantially unity, having the desired imaging resolution, having means (26) to render the image in the same orientation as the object, and having an image field of said predetermined shape and of an area smaller than the substrate band (10) segment (16) area;

(d) means for sequentially presenting and affixing segments (16) of such substrate band (10) to said stage subsystem (18); and (e) control means to operatively interrelate said stage subsystem (18), said substrate segment presenting means, said illumination subsystem (28–34) and said projection subsystem (22–26) to provide additive illumination in certain overlap regions of areas exposed by adjacent scans such that the effect of the exposure dose delivered in said overlap regions is seamless and the effect of the exposure dose delivered across the entire substrate band segment (16) is uniform.

2. A projection imaging system according to claim 1, further characterized in that (a) said illumination subsystem (28–34) has an effective source plane in the shape of a regular hexagon, and illuminates a regular-hexagon-shaped region on said mask (20), and said regular-hexagon-shaped region on the mask is so oriented that two of its six sides are perpendicular to the scan direction; and (b) said projection subsystem (22–26) has an image field in the shape of a regular hexagon, and said regular-hexagon-shaped image field is so oriented that two of its six sides are perpendicular to the scan direction.

3. A projection imaging system according to claim 2, further characterized in that the effective width, w, of each scan, as defined by the lateral separation between the center lines of two adjacent scans, is given by $w = 1.5 \, l_h$, where $l_h$ is the length of each side of said regular-hexagon-shaped illuminated region on the substrate.

4. A projection imaging system according to claim 1, further characterized in that said illumination subsystem (18) provides radiation from a mercury lamp.

5. A projection imaging system according to claim 1, further characterized in that said illumination subsystem (18) provides pulsed radiation from an excimer laser.

6. A projection imaging system according to claim 1, further characterized in that said stage subsystem (18) comprises a planar stage with a first position for said mask (20) and a second position for said substrate band segment (16), the two positions being aligned in the same plane for imaging by said projection subsystem (22–26).

7. A projection imaging system according to claim 1, further characterized in that said stage subsystem (18) comprises a dual-platform stage with a first position on a first platform for said mask (20) and a second position on a second platform for said substrate band segment (16), the two positions being aligned in parallel planes for imaging by said projection subsystem (22–26).

8. A projection imaging system according to claim 1, further characterized in that said stage subsystem substrate segment locking means comprises vacuum means (19) for holding a substrate segment (16) locked in place during exposure by multiple scans.

9. A projection imaging system according to claim 1, further characterized in that said stage subsystem substrate segment locking means comprises a set of stage subsystem entry and stage subsystem exit platens (48,49) for holding a segment (16) of said substrate band (10) locked in place during exposure by multiple scans.

10. A projection imaging system according to claim 9, further characterized in that said stage subsystem (18) entry and exit platens (48,49) have respective motors (60,61) to advance said substrate band (10), and the bottom surface of said substrate band (10) is against the surface of said stage subsystem (18).

11. A projection imaging system according to claim 1, further characterized in that said stage subsystem substrate segment locking means comprises both a vacuum means (19) and a set of stage subsystem entry and stage subsystem exit platens (48, 49) for holding a segment (16) of said substrate band (10) locked in place during exposure by multiple scans.

12. A projection imaging system according to claim 1, further characterized in that said stage subsystem substrate locking means comprises a stage subsystem entry set and a stage subsystem exit set of pinch platens (48–49, 62–63) for holding a segment (16) of said substrate band (10) locked in place during exposure by multiple scans.

13. A projection imaging system according to claim 12, further characterized in that said stage subsystem (18) entry and exit pinch platen sets (48,62/49,63) have respective entry and exit platen motors (60,61) to advance said substrate band (10).

14. A projection imaging system according to claim 1, further characterized in that said stage subsystem substrate locking means comprises both a vacuum means (19) and a stage subsystem entry set and a stage subsystem exit set of pinch platens (48,49; 62,63) for holding a segment (16) of said substrate band (10) locked in place during exposure by multiple scans.

15. A projection imaging system according to claim 1, further characterized in that said substrate presenting means and said control means provide stress relievers operating on said substrate band (10) on entry and exit sides of said stage subsystem (18) so that a substrate band (10) segment (16) remains locked in place on said stage subsystem (18) while being scanned along the longitudinal direction of the substrate band (10), whereby said substrate band (10) remains undamaged.

16. A projection imaging system according to claim 15, further characterized in that said substrate presenting means comprises supply roller means (12) and take-up roller means (14) and said stress relievers are slack lengths (13,15/64,65) sufficient to permit scanning along the longitudinal direction of the substrate band (10) without disturbing the lock of substrate band (10) segment (16) to said stage subsystem (18) and without damage to said substrate band (10).

17. A projection imaging system according to claim 16, further characterized in that said stress relieving slack lengths (13,15/64,65) are sufficient to permit scanning along the longitudinal direction of the substrate band (10) and stepping along the lateral direction without disturbing the lock of the substrate band segment (16) to said stage subsystem (18) and without damage to said substrate band (10).

18. A projection imaging system according to claim 17, further characterized in that (a) said supply roller (12) and said take-up roller (14) have their axes along the same direction;

(b) said substrate band (10) makes two 90 degree turns in its path from said supply roller (12) to said stage subsystem (18) to said take-up roller (14);

(c) said control means controls delivery of said substrate band (10) to provide slack lengths in said two 90 degree turns, to accommodate both longitudinal motion and lateral motion of said stage subsystem (18); and (d) said control means causes said rollers to rotate to release new substrate length from said supply roller (12) and take up exposed substrate length on said take-up roller (14).

19. A projection imaging system according to claim 18, further characterized in that said control means causes said supply roller (12) and said take-up roller (14) to rotate oppositely.

20. A projection imaging system according to claim 18, wherein said stress-relieving slack length between said supply roller (12) and said stage subsystem (18) causes inversion of the plane of said substrate band (10) and said stress-relieving slack length between said stage subsystem (18) and said take-up roller (14) causes re-inversion of the plane of said substrate band (10).

21. A projection imaging system according to claim 18, further characterized in that said substrate band (10) is wound from above on one of said supply roller (12) and said take-up roller (14) and from below on the other, and said control means causes said supply roller and said take-up roller to rotate in the same direction.

22. A projection imaging system according to claim 21, further characterized in that
said supply roller (12) and said take-up roller (14) are mounted on a common axle.

23. A projection imaging system according to claim 17, further characterized in that
said stress relievers comprise movable auxiliary rollers (70,72) to manage and guide the movement of said slack lengths (13,15/64,65) of said substrate band (10).

24. A projection imaging system according to claim 16, further characterized in that
said stress relievers include supply and take-up roller slides (40–45) and said control means controls said roller slides to match the lateral motion of said stage subsystem (18).

25. A projection imaging system according to claim 24, further characterized in that
said stress relievers include slack lengths (46,47) which are insufficient to permit scanning along the longitudinal direction of the substrate band (10) without damage to said substrate band (10) or stress to the locking of said substrate band (10) segment (16) to said stage subsystem (18), but include provision for rotary motions of said supply roller (12) and said take-up roller (14) stages (40–45) which are controlled to match within broad tolerances the motion of said stage subsystem (18) to provide the functions of preventing said damage and relieving said stress.

26. A projection imaging system according to claim 24, further characterized in that
said roller slides (40,41;43,44) are air bearing stages with drive from linear motors (42,45).

27. A projection imaging system according to claim 24, further characterized in that
said roller slides (40,41;43,44) are crossed roller-bearing stages.

28. A projection imaging system according to claim 24, further characterized in that
a) said supply and take-up rollers are controlled to turn simultaneously to accommodate longitudinal scanning of said stage subsystem (18);
b) said roller slides (40–45) are controlled to slide to accommodate lateral stepping of said stage subsystem (18); and
c) said stress relievers include small slack lengths (46,47) in the substrate band (10) to eliminate precision requirements for the roller turning movements.

29. A projection imaging system according to claim 1, further characterized in that
said stage subsystem (18) is fixed, and relative scanning motion of said illumination region of said predetermined shape on said mask (20) is carried out by movement of said illumination subsystem (28–34) and said projection subsystem (22–26).

30. The method of providing a high-throughput, high-resolution, projection patterning system for a large, flexible substrate, in the of a long band, for exposure of a series of panel-segments of such substrate, comprising the following steps:
(a) Providing a stage for holding in fixed juxtaposition both a panel-size segment of the substrate band and a mask, and capable of scanning longitudinally in one direction, and also capable of moving laterally in a direction perpendicular to the scan direction;
(b) Providing an illumination system having the wavelength and intensity distribution characteristics suited for exposure of said substrate, having an effective source plane of a predetermined shape, and capable of uniformly illuminating on said mask a region of said predetermined shape:
(c) Providing a projection assembly having an image field of said predetermined shape on said mask, which image field may be substantially smaller than the size of said panel-segment of the substrate band, and capable of producing a 1:1 magnification image of said illuminated region of said predetermined shape of the mask onto the substrate segment with the required resolution;
(d) Providing an optical reversing unit which, in conjunction with the projection assembly of step (c), helps produce an image on the substrate segment that is in the same orientation as the object pattern on the mask;
(e) Providing rollers to supply and take up the flexible substrate band material and providing mechanisms to affix a panel-segment of the substrate on the stage so as to enable the stage to move both longitudinally and laterally without damaging any portion of the substrate band;
(f) Scanning the stage (a) so that the length of the mask traverses across the illumination region described in step (b);
(g) Stopping the stage momentarily after completion of a scan across the length of the mask, moving the stage by a certain distance in a direction perpendicular to the scan direction, and resuming the scanning of the stage in a direction opposite to the scan direction in step (f);
(h) Providing additive, complementary illumination in certain overlap regions of areas exposed by adjacent scans such that the effect of the exposure dose delivered in said overlap regions is seamless and the effect of the exposure dose delivered across the entire substrate is uniform;
(i) Repeating steps (f–h) until exposure of one entire panel-segment of the substrate is completed;
(j) Releasing the exposed panel-segment of the substrate from the stage, releasing an equal length of substrate from the supply roller, affixing another panel-segment of the substrate on the stage, winding up an equal length of substrate on the take-up roller, and repeating steps (f–i) above until exposure of the entire new panel-segment of the substrate is completed; and
(k) Repeating steps (f–j) above until exposure of the entire roll of substrate band material is completed.

31. The method of providing a projection imaging system according to claim 30, further characterized in that said illumination system has an effective source plane in the shape of a regular hexagon, and is capable of uniformly illuminating a regular-hexagon-shaped region on said mask.

32. A high-throughput, projection patterning system for a roller-to-roller transported substrate band (10) of semi-flexible substrate material for imaging of a longitudinally arranged sequence of substrate band segments (16), comprising:
(a) substrate segment imaging means comprising an x-y stage subsystem (18) and locking means to hold such a segment (16) of said semi-flexible substrate band (10) in a fixed imaging position with respect to a mask (20) and in a precisely and controllably variable position with respect to stationary imaging means;
(b) substrate supply means (12/40) for presenting such semi-flexible substrate band (10) to said imaging means;

(c) substrate take-up means (14/43) for accepting such semi-flexible substrate band (10) from said imaging means; and (d) supply stress-relieving means intermediate said substrate supply means and said imaging means; and (e) take-up stress-relieving means intermediate said imaging means and said substrate take-up means.

33. A high-throughput, projection patterning system according to claim 32, wherein said supply stress-relieving means is a slack length of said substrate band (10) that causes inversion of the plane of the substrate band (10) and said take-up stress relieving means is a slack length that causes re-inversion of the plane of the substrate band (10).

34. A high-throughput, projection patterning system according to claim 32, wherein said supply and take-up stress relieving means are controlled-motion mechanisms for moving the respectively related substrate supply means and substrate take-up means synchronously with movement of said stage subsystem (18).

35. A high-throughput, projection patterning system according to claim 32, wherein said supply and take-up stress relieving means comprise substrate slack length control mechanisms for keeping the related substrate supply means and substrate take-up means isolated from longitudinal and lateral movements of said imaging means.

36. A high-throughput, projection patterning system according to claim 35 wherein said supply stress relieving means and take-up stress relieving means include means for managing the isolation of the related substrate supply means and substrate take-up means from longitudinal and lateral movements of said imaging means.

37. A high-throughput, projection patterning system comprising (a) means for feeding a substrate band (10) to present a substrate band segment (16) for imaging at a imaging station;

(b) locking means to affix said substrate band segment (16) and a mask (20) to said imaging station in a fixed mutual spatial relationship;

(c) an illumination subsystem for illuminating a polygonal region on said mask;

(d) a projection subsystem for imaging said illuminated polygonal mask region onto said substrate band segment;

(e) means for providing a sequence of scanning motions of said illumination subsystem and said projection subsystem, relative to said fixed mask (20) and said fixed substrate band segment (16);

whereby said substrate band segment (16) is exposed seamlessly and uniformly by a sequence of overlapping polygonal scans.

\* \* \* \* \*